United States Patent
Chang et al.

(10) Patent No.: US 9,018,974 B2
(45) Date of Patent: Apr. 28, 2015

(54) IMPEDANCE CALIBRATION DEVICE AND METHOD

(71) Applicant: Realtek Semiconductor Corp., HsinChu (TW)

(72) Inventors: Che-Wei Chang, HsinChu (TW); Cheng-Pang Chan, Kaohsiung (TW); Jian-Ru Lin, Nantou County (TW)

(73) Assignee: Realtek Semiconductor Corp., Hsinchu (TW)

( * ) Notice: Subject to any disclaimer, the term of this patent is extended or adjusted under 35 U.S.C. 154(b) by 174 days.

(21) Appl. No.: 13/764,403

(22) Filed: Feb. 11, 2013

(65) Prior Publication Data

US 2013/0234755 A1    Sep. 12, 2013

(30) Foreign Application Priority Data

Mar. 7, 2012   (TW) .............................. 101107781 A

(51) Int. Cl.
   *H03K 19/00*   (2006.01)

(52) U.S. Cl.
   CPC ................................. *H03K 19/0005* (2013.01)

(58) Field of Classification Search
   USPC .......................... 326/30, 26, 82; 341/155, 156
   See application file for complete search history.

(56) References Cited

U.S. PATENT DOCUMENTS

| | | | |
|---|---|---|---|
| 6,734,702 B1 | 5/2004 | Ikeoku et al. | |
| 7,332,933 B2* | 2/2008 | Kim et al. | 326/30 |
| 7,423,450 B2* | 9/2008 | Santurkar et al. | 326/30 |
| 7,719,309 B2* | 5/2010 | Santurkar et al. | 326/30 |
| 2005/0280568 A1* | 12/2005 | Rowland et al. | 341/155 |
| 2006/0261845 A1* | 11/2006 | Kim et al. | 326/30 |
| 2008/0061818 A1* | 3/2008 | Santurkar et al. | 326/30 |
| 2008/0297193 A1* | 12/2008 | Santurkar et al. | 326/30 |
| 2012/0223736 A1 | 9/2012 | Wu et al. | |

* cited by examiner

*Primary Examiner* — Daniel D Chang

(74) *Attorney, Agent, or Firm* — Muncy, Geissler, Olds & Lowe, P.C.

(57) ABSTRACT

An impedance calibration device includes: a variable impedance, an operational unit, an analog-digital converter, and a controller. The operational unit receives a first analog signal and a second analog signal, and performs a difference operation to generate an output voltage. The analog-digital converter generates an adjustment code according to the output voltage. The controller is coupled to the analog-digital converter and the variable impedance, and adjusts a resistance value of the variable impedance according to the adjustment code.

18 Claims, 8 Drawing Sheets

IMPEDANCE CALIBRATION DEVICE AND METHOD

CROSS-REFERENCES TO RELATED APPLICATIONS

This non-provisional application claims priority under 35 U.S.C. §119(a) on Patent Application No. 101107781 filed in Taiwan, R.O.C. on Mar. 7, 2012, the entire contents of which are hereby incorporated by reference.

BACKGROUND

1. Technical Field

The disclosure relates to a calibration device, and in particular, to an impedance calibration device and method.

2. Related Art

When a process variation happens during a semiconductor manufacturing process, the characteristic of a component in an integrated circuit (IC) changes accompany with the process variation, for example, a resistance value of impedance varies. The variation of a resistor may have different influences on different electronic components. For example, a change of a resistor causes a bandwidth variation in a filter. For another example, the variation of the resistor causes a frequency variation in an oscillator. For another example, in a communication system, impedance matching between a transmitting end and a receiving end is strictly regulated. Impedance mismatching causes risks of signal distortion and even signal interruption, and a change of a resistor may cause the problem of impedance mismatching. Therefore, how to overcome a variation of the resistance value caused by the process variation is always a challenge to the design of an IC.

Traditionally, a trimming manner is adopted to calibrate the resistance value, or the process control is used to reduce a variation amount of the process. However, the former increases the testing time and cost, while the latter increases the manufacturing cost of an IC, both of which are uneconomical.

In view of this, a new architecture is put forward to accurately calibrate an internal impedance of an IC and to further reduce the cost.

SUMMARY

In view of the above problems in the prior art, the disclosure provides an impedance calibration device, which includes: a variable impedance, an operational unit, an analog-digital converter, and a controller. The operational unit receives a first analog signal and a second analog signal, and performs an operation to generate an output voltage. The analog-digital converter receives the output voltage to generate an adjustment code. The controller is coupled to the analog-digital converter and the variable impedance, and adjusts a resistance value of the variable impedance according to the adjustment code.

The disclosure further provides an impedance calibration method, which includes: performing an operation on a first analog signal and a second analog signal to generate an output voltage; receiving the output voltage to generate an adjustment code; and adjusting a resistance value of a variable impedance according to the adjustment code.

To sum up, in the impedance calibration device and method according to the disclosure, a self-calibration mechanism is adopted. First, in an analog domain, a difference operation is performed on the second analog signal used for reference and the first analog signal corresponding to the resistance value of the variable impedance to obtain a variation amount of the resistance value. Next the variation amount is converted into a digital code (that is, the adjustment code), so that a digital circuit (that is, the controller), determines the variation amount of the process, and corrects the resistance value of the variable impedance according to the variation amount of the process by utilizing a programmable characteristic of a digital domain.

In order to make the above and other objectives, features and merits of the disclosure more comprehensible, several exemplary embodiments are illustrated in detail with reference to the accompanying drawings in the following pages.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
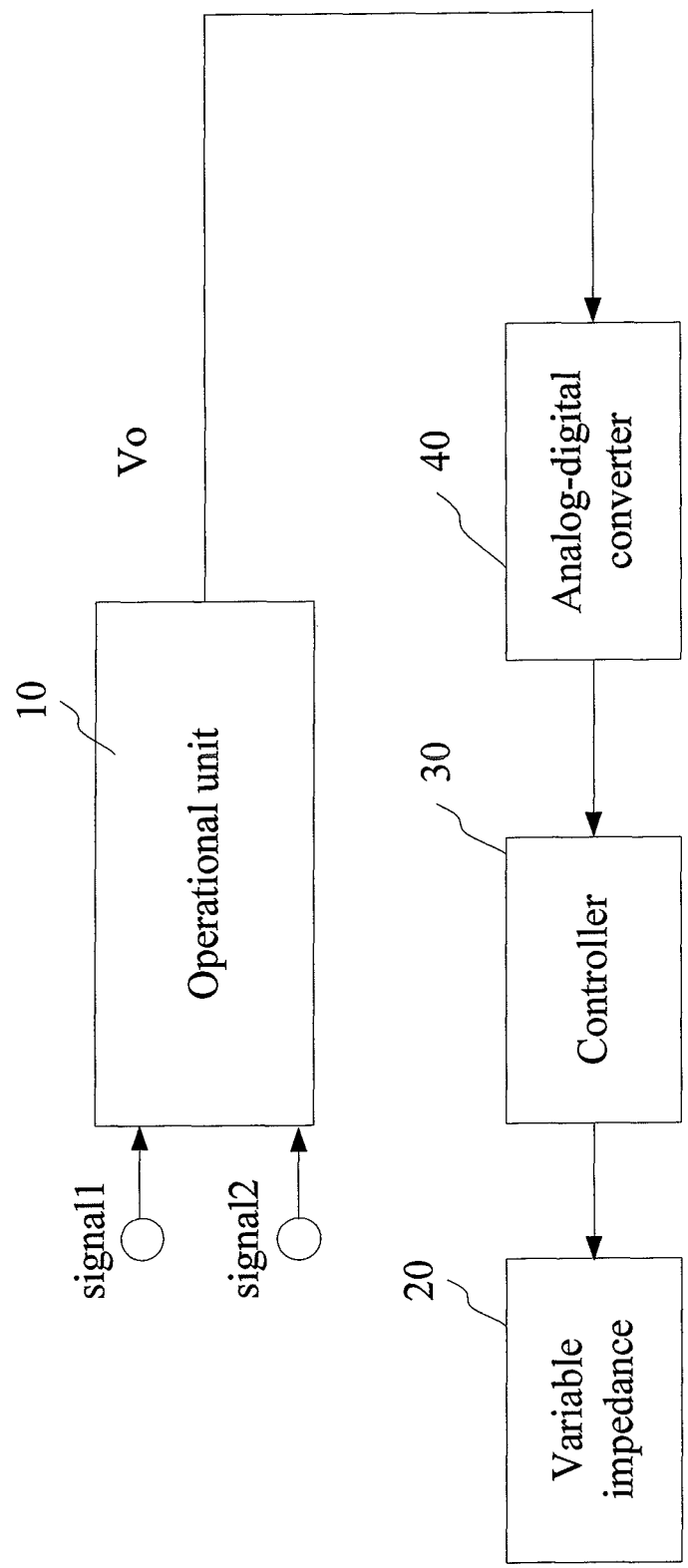
FIG. 1 is a schematic view of a first embodiment of an impedance calibration device according to the disclosure.

FIG. 1 is a schematic view of a first embodiment of an impedance calibration device according to the disclosure. The impedance calibration device includes: an operational unit 10, a variable impedance 20, a controller 30, and an analog-digital converter 40. The analog-digital converter 40 is coupled between the operational unit 10 and the controller 30, and the controller 30 is coupled between the analog-digital converter 40 and the variable impedance 20. The operational unit 10 receives a first analog signal Signal 1 and a second analog signal Signal 2, and performs a difference operation on the first analog signal Signal 1 and the second analog signal Signal 2 to generate an output voltage Vo. The analog-digital converter 40 generates an adjustment code according to the output voltage Vo. The controller 30 adjusts a resistance value of the variable impedance 20 according to the adjustment code.

Figure 2:
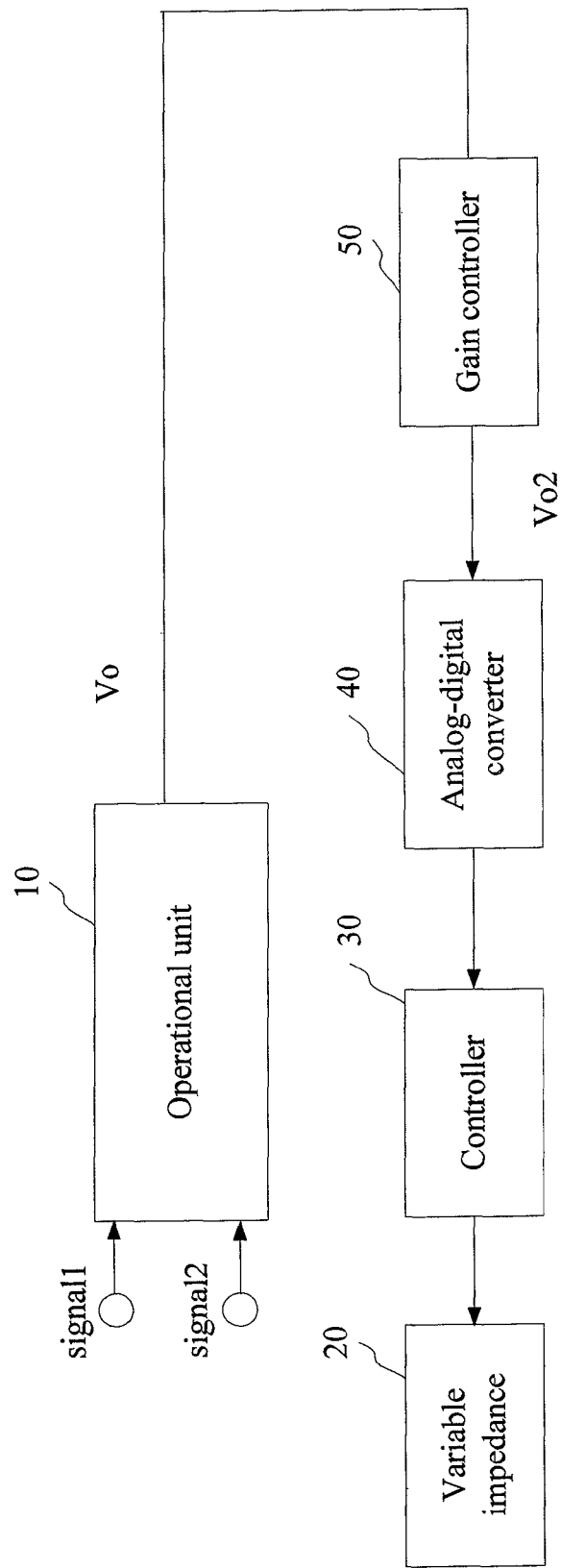
FIG. 2 is a schematic view of a second embodiment of an impedance calibration device according to the disclosure.

FIG. 2 is a schematic view of a second embodiment of an impedance calibration device according to the disclosure. A gain controller 50 may be disposed between the operational unit 10 and the analog-digital converter 40. The output voltage Vo generated by the operational unit 10 is first output to the gain controller 50. The gain controller 50 adjusts the output voltage Vo to generate an adjusted output voltage Vo2, and provides the adjusted output voltage Vo2 to the analog-digital converter 40. The analog-digital converter 40 performs analog-to-digital conversion on the adjusted output voltage Vo2 to generate a digital adjustment code. The output voltage Vo is a differential voltage generated by two end points, or a voltage to earth generated by a single end.

The first analog signal Signal 1 and the second analog signal Signal 2 may be current signals. In addition, the first analog signal Signal 1 and the second analog signal Signal 2 may also be voltage signals.

Figure 3:
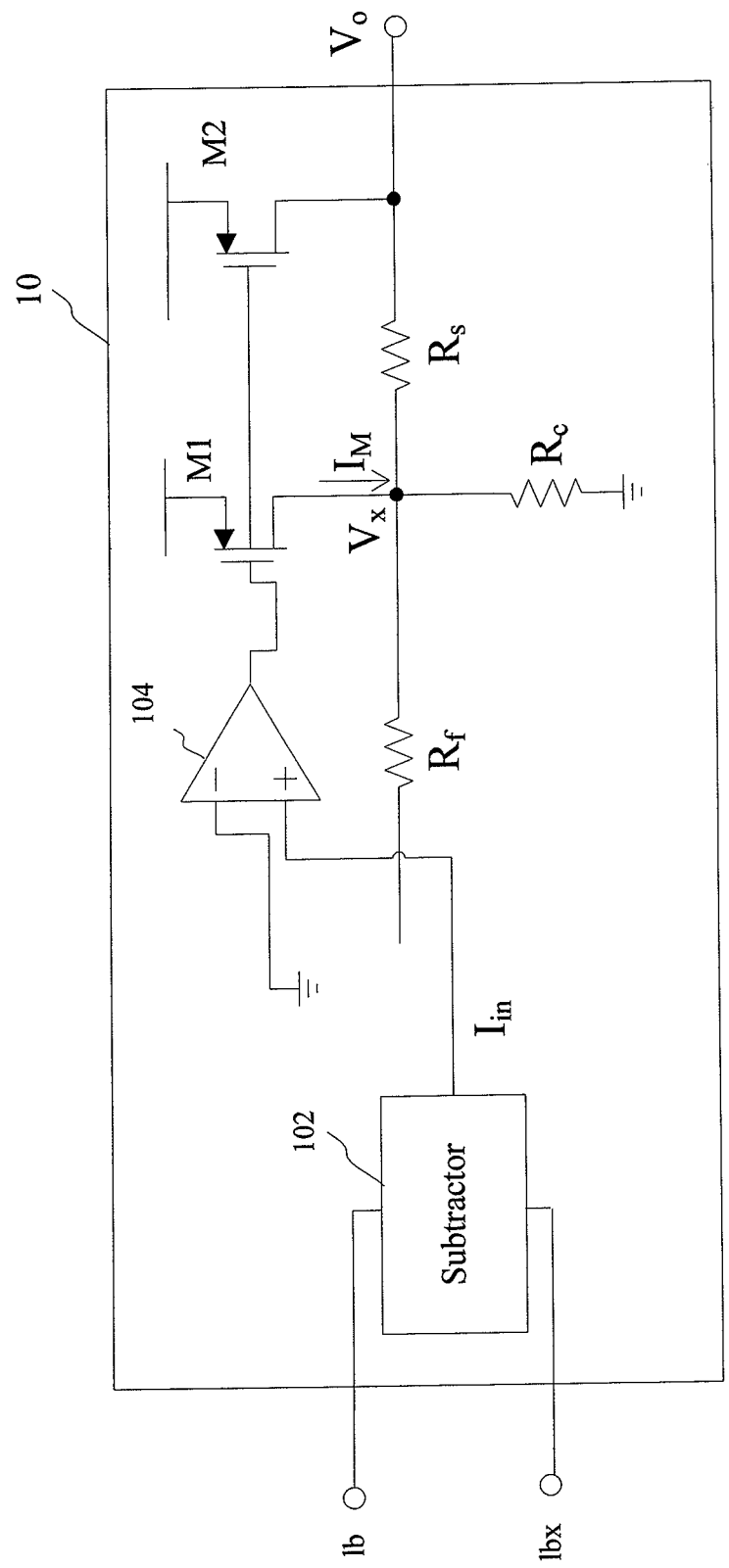
FIG. 3 is a schematic view of a first detailed structure of an operational unit of an impedance calibration device according to the disclosure.

FIG. 3 is a schematic view of an embodiment of the operational unit 10 shown in FIG. 2. In a circuit architecture shown in FIG. 3, the operational unit 10 is represented in a small signal mode. The first analog signal is a first current Ib, and the second analog signal is a second current Ibx. The first current Ib is a signal that varies along with a process, and the second current Ibx is a signal that does not vary along with the process. Therefore, a variation amount of the process may be indirectly obtained by comparing the two (the first current Ib and the second current Ibx). For ease of description, it is assumed that the variation amount is Δ % (Δ may be positive or negative).

The first current Ib is generated according to a ratio between a predetermined voltage and an internal resistor Rpoly of a chip. In an embodiment, a relational expression between the first current Ib and the internal resistor Rpoly is $$Ib = K1 \times \frac{Vbg}{Rpoly}$$

$$= K2 \frac{Vbg}{Rpoly'(1+\Delta)}$$

$$= K3 \frac{Vbg}{(1+\Delta)},$$

where Vbg is a predetermined voltage that does not change along with a temperature change and process drift, while K1, K2, and K3 are adjustment parameters of the first current Ib. Since a process variation may occur to the internal resistor Rpoly of the chip, Rpoly may be represented as Rpoly'(1+Δ), where Rpoly' is an ideal resistance value of the internal resistor.

The second current Ibx is generated according to a ratio between the predetermined voltage and an external reference resistor $R_{ext}$ (or referred to as an accurate external resistor of the chip). In an embodiment, a relational expression between the second current Ibx and the external reference resistor $R_{ext}$ is $$Ibx = K4 \times \frac{Vbg}{R_{ext}}$$

$$= K5 \times Vbg,$$

where K4 and K5 are proportional differences for adjusting the first current Ib and the second current Ibx.

Here, a resistance value of the external reference resistor $R_{ext}$ is an ideal resistance value corresponding to the internal resistor Rpoly (that is, a resistance value when the process drift does not occur). Therefore, the variation amount may be obtained by computing a difference between the first current Ib and the second current Ibx.

The internal resistor of the chip has multiple forms, and common forms include a poly resistor and a diffusion resistor. The poly resistor is formed by a polycrystalline material such as poly silicon in the chip, while the diffusion resistor is formed by an area that undergoes a diffusion process in the chip. The above resistor forms are not intended to limit the disclosure, and the concept disclosed by the disclosure may also be used in an internal resistor of another form.

The operational unit 10 includes: a subtractor 102, an operational amplifier 104, a first transistor M1, a second transistor M2, a first resistor Rf, a second resistor Rc, and a third resistor Rs.

An input end of the subtractor 102 receives the first current Ib and second current Ibx, and an output end of the subtractor 102 is coupled to a second end (for example, a positive input end), of the operational amplifier 104.

The subtractor 102 subtracts the second current Ibx from the first current Ib to generate a difference current $I_{in}$. A first end (for example, a negative input end) of the operational amplifier 104 is grounded, and the second end thereof receives the difference current $I_{in}$. A second end of the first transistor M1 is coupled to a third end (for example, an output end), of the operational amplifier 104, and a first end thereof is connected to a power supply. A second end of the second transistor M2 is coupled to the second end of the first transistor M1, and a first end thereof is connected to the power supply. A first end of the first resistor Rf is coupled to the second end of the operational amplifier 104, and a second end thereof is coupled to a third end of the first transistor M1. A first end of the second resistor Rc is coupled to the third end of the first transistor M1, and a second end thereof is coupled to the ground. A first end of the third resistor Rs is coupled to the third end of the first transistor M1, and a second end thereof is coupled to a third end of the second transistor M2. Hereupon, the second end of the third resistor Rs generates an output voltage Vo.

The architectures shown in FIG. 2 and FIG. 3 are taken as an example, and conditions of the variable impedance 20 are exemplarily described as follows.

$$V_x = I_{in} \times R_f \quad \text{Formula f.1}$$

$$I_M = I_{in} + \frac{V_x}{R_c} + \frac{V_x - V_o}{R_s} \quad \text{Formula f.2}$$

$$I_M \times N = \frac{V_o - V_x}{R_s} \quad \text{Formula f.3}$$

Formula f.2 is substituted into the formula f.3:

$$I_{in} \times N + \frac{N \times V_x}{R_c} + N \times \frac{V_x - V_o}{R_s} = \frac{V_o - V_x}{R_s} \quad \text{Formula f.4}$$

$$I_{in} \times N + \frac{N \times V_x}{R_c} = (N+1)\frac{V_o - V_x}{R_s}$$

$$V_x + \frac{N}{N+1} \times I_{in} \times R_s + \frac{N}{N+1}\frac{R_s}{R_c}V_x = V_o$$

$$V_o = I_{in} \times \left[R_f + \frac{N}{N+1}R_s + \frac{N}{N+1}\frac{R_s}{R_c}R_f\right]$$

It is defined that $$R_s = R_s'^*(1+\Delta)$$

and $$R_f = R_f'^*(1+\Delta)$$

It is defined that $Ib=k\times V_{bg}/(1+\Delta)$, where k is a constant, and that $Ibx=k\times V_{bg}$, where k is a constant.

First, $I_{in}=Ib-Ibx$ is substituted into the formula f.4:

$$V_o = \left[\frac{kV_{bg}}{1+\Delta} - kV_{bg}\right] \times \qquad \text{Formula f.5}$$

$$\left[\begin{array}{l} R'_f(1+\Delta) + \dfrac{N}{N+1}R'_s(1+\Delta) + \\ \dfrac{N}{N+1}\dfrac{R'_s(1+\Delta)}{R'_c(1+\Delta)}R'_f(1+\Delta) \end{array}\right]$$

$$= kV_{bg}\left[R'_f + \frac{N}{N+1}R'_s + \frac{N}{N+1}\frac{R'_s}{R'_c}R_{f'}\right] +$$

$$[1 - (1+\Delta)]$$

$$= K \times \Delta$$

$V_x$ is a voltage of a node where the third end of the first transistor M1, the first resistor Rf, the second resistor Rc and the third resistor Rs are coupled. $I_M$ represents a current flowing through the node, and N is a constant. $I_{in}$ represents the difference current output by the subtractor 102, that is, an input current of the second end of the operational amplifier 104. K is a constant value, and Δ is a variation amount of the resistance value of the variable impedance 20 generated due to the process.

It can be obtained from the above Formula f.5 that, the output voltage Vo is equal to a constant value (K) multiplied by the variation amount (Δ).

On the basis of Formula f.5, it is assumed that Δ is 0.2, indicating that the variation amount is 20%, and at this time, the output voltage Vo has a variation amount of 20%. Likewise, when Δ is 0.1, it indicates that the variation amount is 10%, and at this time, the output voltage Vo has a variation amount of 10%. If a system is normal and has no variation amount, that is, Δ is 0, the output voltage is 0 (Vo=K×0).

The input current ($I_{in}$) of the second end of the operational amplifier 104 is the received first current Ib or second current Ibx. In the impedance calibration device and method according to the disclosure, first, the second current Ibx is subtracted from the first current Ib, and then a difference thereof is substituted into the above Formula f.4 to obtain the output voltage Vo (Vo=K×Δ). The gain controller 50 receives the output voltage Vo and generates an adjusted output voltage Vo2. It is assumed that the gain controller 50 multiplies the output voltage Vo by β to obtain the adjusted output voltage Vo2 (Vo2=K×Δ×β). A voltage range of the adjusted output voltage Vo2 may comply with a full dynamic range of the analog-digital converter 40.

The full dynamic range is a range of an input voltage of the analog-digital converter 40. A 7-bit analog-digital converter 40 is taken as an example for illustration. It is assumed that the full dynamic range of the input voltage of the analog-digital converter 40 is from −1 V to 1 V, where 0 V is mapped to a digital code 0, 1 V is mapped to a digital code 63, and −1 v is mapped to a digital code −64.

Therefore, the gain controller 50 is set, so as to map a voltage range of a voltage (that is, the adjusted output voltage Vo2) provided for the analog-digital converter 40 to the input voltage within the input range of the analog-digital converter 40, that is, to achieve an effect of the full dynamic range. For example, in accordance with the above example, the full dynamic range of the input voltage of the analog-digital converter 40 is from −1 V to 1 V. K is a known constant in the equation Vo=K×Δ because the variation amount Δ has a predicted range in the process, for example, a range from ±0.2 to ±0.3, that is, a range from ±20% to ±30%. Therefore, before a value of β is designed, a value of $\Delta_{max}$ may be predetermined as, for example, ±0.2, and as a result, a largest value of Vo is 0.2K. It is assumed that 0.2 K>1, then it may be designed that β<1; if 0.2 K<1, it may be designed that β>1, so that Vo2=K× $\Delta_{max}$×β=1, thereby achieving the effect of the full dynamic range.

It should be noted that in the above embodiment, although it is taken as an example that the bit number of the analog-digital converter 4 is 7, the disclosure is not limited thereto. The bit number of the analog-digital converter may also be, for example, less than 7. The bit number may be any value such as 8, 9, 10, and so on, and may be selected according to the design of the system.

The analog-digital converter 40 receives the adjusted output voltage Vo2 and converts the adjusted output voltage Vo2 to a digital adjustment code Vcode. Then, the controller 30 adjusts the resistance value of the variable impedance 20 according to the adjustment code Vcode.

For example, it is assumed that the variation amount Δ generated by the variable impedance 20 due to the process is 10%. At this time, the output voltage Vo (Vo=K×Δ) obtained by the operational unit 10 indicates that the variation amount is 10%. The gain controller 50 multiplies the output voltage Vo by β to generate the adjusted output voltage Vo2 (Vo2=K× Δ×β). Hereupon, the adjusted output voltage Vo2 is mapped to the full dynamic range of the analog-digital converter 40. Next, the analog-digital converter 40 generates the adjustment code Vcode based on the adjusted output voltage Vo2, so that the adjustment code Vcode also indicates that the variation amount is 10%. At this time, the controller 30 adjusts the resistance value of the variable impedance 20 according to the variation amount of 10% (that is, the adjustment code Vcode), where the design of the gain controller 50 may be achieved by use of resistance division. However, the disclosure does not limit the structure of the gain controller 50.

Two examples are listed for illustration in the following.

Example 1

It is assumed that a maximum variation amount is ±20%, the output voltage Vo is 1.2 V, and an adjustment rate β of the gain controller 50 is 0.8. At this time, the output voltage Vo is multiplied by β to obtain the adjusted output voltage Vo2, which is 0.96. The 7-bit analog-digital converter 40 is adopted, and therefore the full dynamic range covers digital values from −64 to 63. It is assumed that a maximum voltage that can be measured by the analog-digital converter 40 is 1 V. Therefore, when the adjusted output voltage Vo2 is 1 V, the adjustment code Vcode obtained by the analog-digital converter 40 is equal to 63, that is, corresponding to the maximum variation amount of 20%. At this time, the adjusted output voltage Vo2 is 0.96, and according to $$\frac{1}{63} = \frac{0.96}{Vcode},$$

the adjustment code Vcode obtained by the controller 30 is 60. The controller 30 computes the variation amount according to the adjustment code Vcode (Vcode=60), or adjusts the resistance value of the variable impedance 20 through a table look-up method. It is assumed that a current resistance value of the variable impedance 20 is 2k, the controller 30 may perform computation according to $$\frac{20\%}{63} = \frac{x\%}{60},$$

to obtain that the adjustment code Vcode is equal to 60, which indicates a variation of 19%. In other words, the controller 30 adjusts the resistance value of the variable impedance according to the maximum variation amount (20%) of the variable impedance and the full dynamic range (±1V) of the analog-digital converter. In another embodiment, the variation amount corresponding to each Vcode may also be stored in a table, so as to provide a table to be looked up. Therefore, it is necessary to adjust 2k upward by 19%, that is, 2k+2k*0.19, which is equal to about 2.38 k. Therefore, based on that the adjustment code Vcode is 60, the controller 30 adjusts the resistance value of the variable impedance 20 from 2k to about 2.38 k.

Example 2

It is assumed that the maximum variation amount is ±20%, the output voltage Vo is 0.4 V, and the adjustment rate β of the gain controller 50 is 1.2. The output voltage Vo is multiplied by β to obtain the adjusted output voltage Vo2 (Vo2=0.48). The 7-bit analog-digital converter 40 is adopted, and therefore the full dynamic range covers digital values from −64 to 63. It is assumed that the maximum voltage that can be measured by the analog-digital converter 40 is ±1V. Therefore, when the adjusted output voltage Vo2 is 1 V, the analog-digital converter 40 obtains the adjustment code Vcode (Vcode=63) through conversion. At this time, the adjusted output voltage Vo2 is 0.48, and according to $$\frac{1}{63} = \frac{0.48}{Vcode},$$

the adjustment code Vcode obtained by the controller 30 is 30. The controller 30 computes the variation amount according to the adjustment code Vcode (Vcode=30), or adjusts the resistance value of the variable impedance 20 through the table look-up method. It is assumed that the current resistance value of the variable impedance 20 is 2k. The controller 30 may perform computation according to $$\frac{20\%}{63} = \frac{x\%}{30},$$

to obtain that the adjustment code Vcode is equal to 30, which indicates 9.5%. In other words, the controller 30 adjusts the resistance value of the variable impedance according to the maximum variation amount (20%) of the variable impedance and the full dynamic range (±1V) of the analog-digital converter. In another embodiment, the variation amount corresponding to each Vcode may also be stored in a table, so as to provide a table to be looked up. Therefore, it is necessary to adjust the resistance value 2k of the variable impedance 20 upward by 9.5%, that is, 2k+2k*0.095, which is equal to about 2.2 k. Therefore, based on that the adjustment code Vcode is 30, the controller 30 adjusts the resistance value of the variable impedance 20 from 2k to about 2.2 k.

Likewise, when the maximum variation amount is ±20% and the output voltage Vo is a negative value, if the output voltage Vo is mapped to −1V of the full dynamic range of the analog-digital converter 40, the analog-digital converter 40 obtains the adjustment code Vcode (Vcode=−64) through conversion, and after the output voltage Vo is multiplied by β, the obtained adjusted output voltage Vo2 (Vo2=βVo) is also a negative value, and an adjustment code corresponding thereto may be computed in the above manner. An operation method of the variation amount of the variable impedance is the same as the operation method of a positive variation amount, which is not described herein again.

Therefore, when Ib−Ibx>0, it indicates that the resistance value of the internal resistor is low and must be adjusted upward. At this time, the output voltage obtained according the Formula f.5 is a positive value, and an adjustment direction of the variable impedance is to increase the resistance value of the internal resistor. When Ib−Ibx<0, it indicates that the resistance value of the internal resistor is high and must be adjusted downward. At this time, the output voltage obtained according to the Formula f.5 is a negative value, and an adjustment direction of the variable impedance is to decrease the resistance value of the internal resistor. Details are the same as those in Example 1 and Example 2, which are not described herein again.

Figure 4:
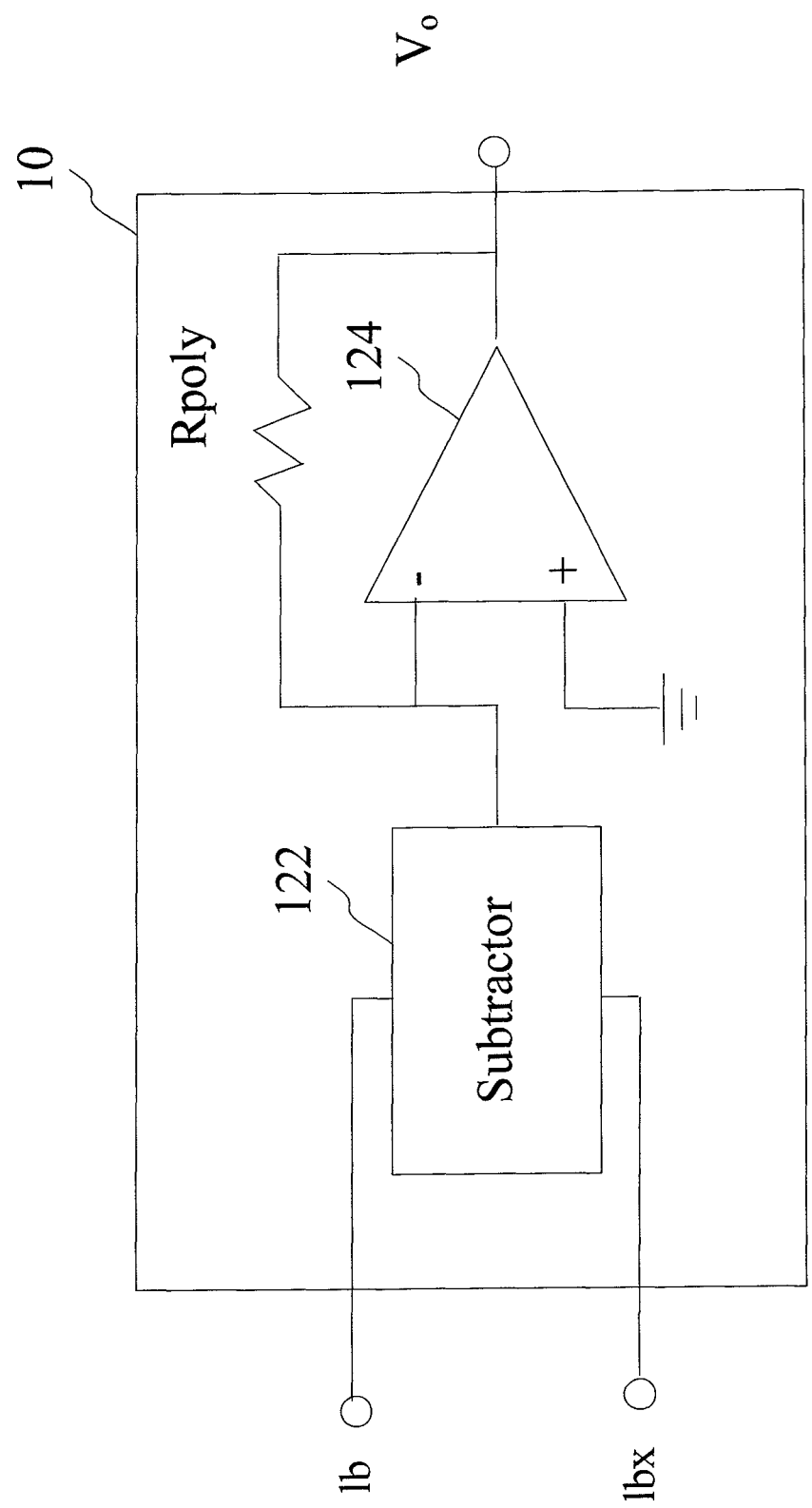
FIG. 4 is a schematic view of a second detailed structure of an operational unit of an impedance calibration device according to the disclosure.

FIG. 4 is a schematic circuit diagram of a second embodiment of the operational unit shown in FIG. 1. Please refer to FIG. 4, in which the operational unit 10 includes: a subtractor 122, an operational amplifier 124, and a resistor R.

In this embodiment, the first analog signal is a first current Ib, and the second analog signal is a second current Ibx.

The subtractor 122 subtracts the second current Ibx from the first current Ib to generate a difference current. A first end of the operational amplifier 124 is coupled to the subtractor 122 and receives the difference current. A second end of the operational amplifier 124 is grounded, and a third end thereof generates an output voltage Vo. A first end of a resistor Rpoly is coupled to the first end of the operational amplifier 124, and a second end thereof is coupled to the third end of the operational amplifier 124.

In this embodiment, the resistor R may be used to adjust the output voltage Vo, so that the output voltage Vo is mapped to a full dynamic range of the analog-digital converter 40, and a relational expression thereof is Vo=(Ib−Ibx)*Rpoly. Since $$Ib = K \times \frac{Vbg}{Rpoly}, Ibx = K \times \frac{Vbg}{R_{ext}},$$

and Rpoly=Rpoly(desire)×(1+Δ), it may be obtained through formula derivation that the output voltage Vo is equal to a constant K multiplied by Δ, that is, Vo=K−Δ, so that the output voltage Vo may be directly mapped to the full dynamic range of the analog-digital converter 40. The first current Ib is a current that contains a variation amount and is computed by use of an internal resistor, and the second current Ibx is an accurate current computed by use of an external reference resistor. The method for adjusting the variable impedance is similar to that in Example 1 and Example 2, which is not described herein again.

Figure 5:
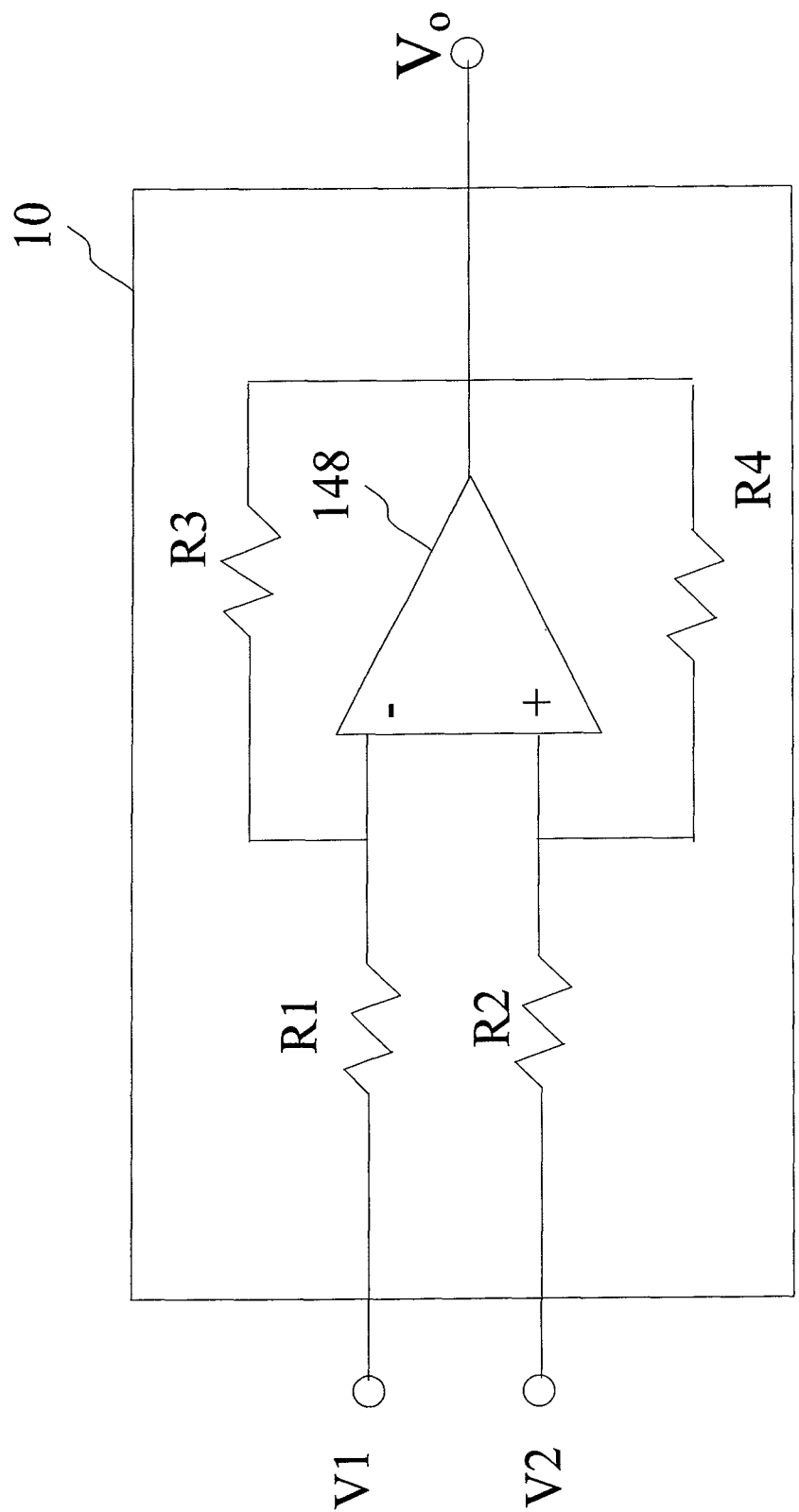
FIG. 5 is a schematic view of a third detailed structure of an operational unit of an impedance calibration device according to the disclosure.

FIG. 5 is a schematic view of a third detailed structure of the operational unit shown in FIG. 1. The operational unit 10 includes: an operational amplifier 148, a first resistor R1, a second resistor R2, a third resistor R3, and a fourth resistor R4.

In this embodiment, the first analog signal is a first voltage signal V1, and the second analog signal is a second voltage signal V2. A first end of the operational amplifier 148 is coupled to the subtractor 122 and receives a difference current. A second end of the operational amplifier 148 is grounded, and a third end thereof is an output voltage Vo. A first end of the first resistor R1 receives the first voltage signal V1, and a second end thereof is coupled to the first end of the operational amplifier 148. A first end of the second resistor R2 receives the second voltage signal V2, and a second end thereof is coupled to the second end of the operational amplifier 148. A first end of the third resistor R3 is coupled to the first end of the operational amplifier 148, and a second end thereof is coupled to the third end of the operational amplifier 148. A first end of the fourth resistor R4 is coupled to the second end of the operational amplifier 148, and a second end thereof is coupled to the third end of the operational amplifier 148.

Here, a relational expression among the first voltage signal V1, the second voltage signal V2, the output voltage Vo, the first resistor R1, the second resistor R2, the third resistor R3, and the fourth resistor R4 may be obtained:

$$Vo = V2\frac{R4}{R2} - V1\frac{R3}{R1}.$$

For example, $$V2 = Ib \times R_{poly} = K \times \frac{Vbg}{Rpoly} \times R_{poly}$$

may be regarded as a reference voltage, and $$V1 = Ibx \times R_{poly} = K \times \frac{Vbg}{R_{ext}} \times R_{poly},$$

where Rpoly=Rpoly(desire)×(1+Δ), may be regarded as a voltage carrying variation amount information. It may be obtained through formula derivation that the output voltage Vo is equal to a constant K multiplied by Δ, that is, Vo=K–Δ, so that the output voltage Vo may be directly mapped to the full dynamic range of the analog-digital converter 40. Therefore, in this embodiment, the output voltage Vo may be adjusted by use of the first resistor R1, the second resistor R2, the third resistor R3, and the fourth resistor R4, so that the output voltage Vo is mapped to the full dynamic range of the analog-digital converter 40. If a variation amount of the process may be obtained from the output voltage Vo, and the variation amount of the process is a variation of an IC internal resistor caused by a variation of the process, and as a result, the resistance value of the variable impedance 20, which is a part of the IC internal resistor, also varies due to the process variation. A method for adjusting the variable impedance is similar to that in Example 1 and Example 2, which is not described herein again.

Figure 6:
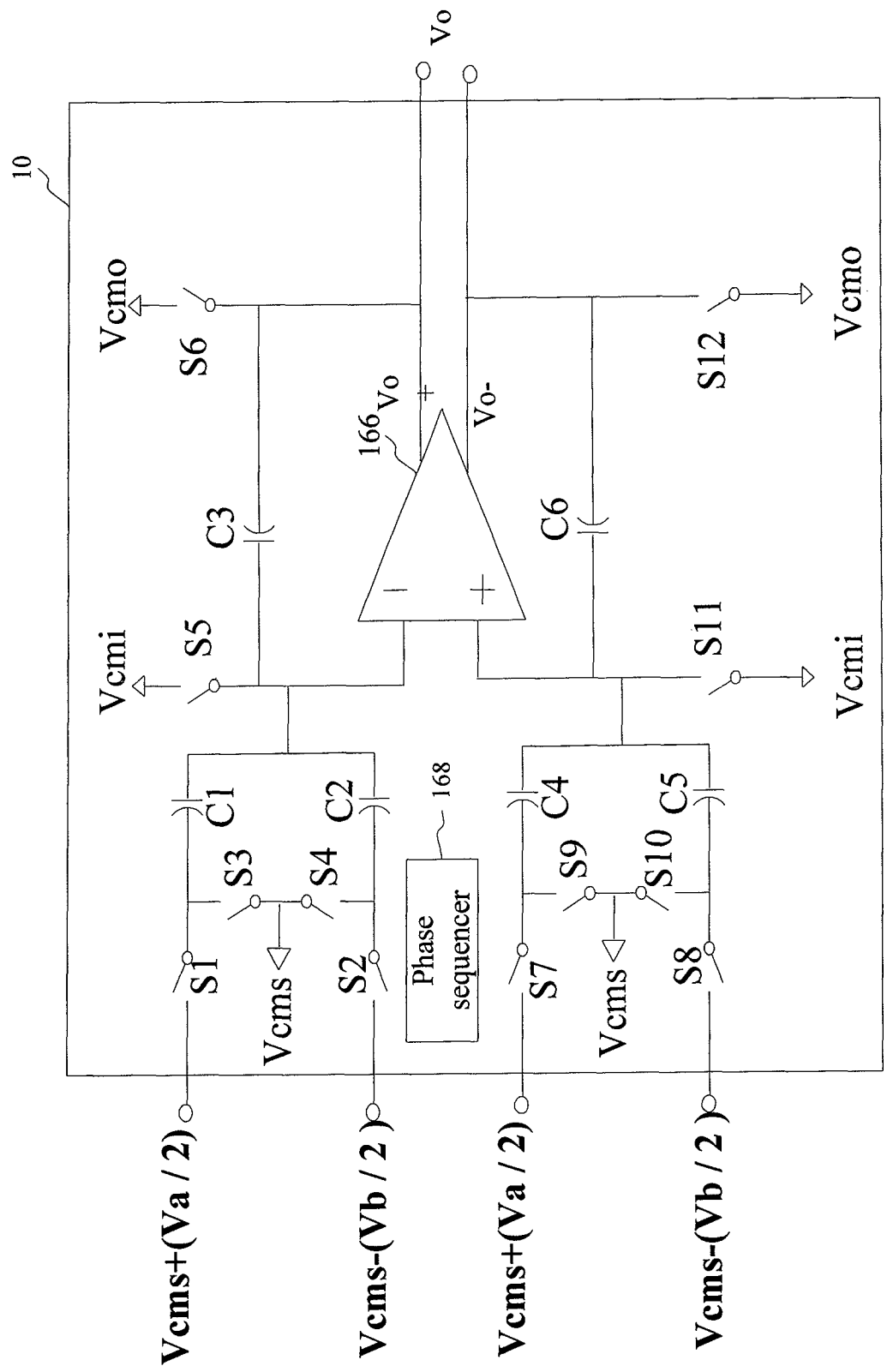
FIG. 6 is a schematic view of a fourth detailed structure of an operational unit of an impedance calibration device according to the disclosure.

Then, please refer to FIG. 6, which is a schematic view of a detailed structure of a fourth embodiment of the operational unit shown in FIG. 1. The operational unit 10 includes: a capacitor switching unit, an operational amplifier 166, and a phase sequencer 168. The capacitor switching unit has a plurality of capacitors and a plurality of switches. The phase sequencer is coupled to the capacitor switching unit, and controls opening and closing timing of these switches to charge and discharge these capacitors. The operational amplifier 166 is coupled to the capacitor switching unit, and performs a difference operation by using charge and discharge of these capacitors, so as to generate a first operation voltage and a second operation voltage. The operational amplifier subtracts the second operation voltage from the first operation voltage to generate an output voltage, and enables the output voltage to correspond to a full dynamic range of the analog-digital converter.

The capacitor switching unit further includes: a first capacitor C1, a second capacitor C2, a third capacitor C3, a fourth capacitor C4, a fifth capacitor C5, a sixth capacitor C6, a first switch S1, a second switch S2, a third switch S3, a fourth switch S4, a fifth switch S5, a sixth switch S6, a seventh switch S7, an eighth switch S8, a ninth switch S9, a tenth switch S10, an eleventh switch S11, and a twelfth switch S12. A second end of the first capacitor C1 is coupled to a first end of the operational amplifier 166. A second end of the second capacitor C2 is coupled to the first end of the operational amplifier 166. A first end of the third capacitor C3 is coupled to the first end of the operational amplifier 166, and a second end thereof is coupled to a third end of the operational amplifier 166. A second end of the fourth capacitor C4 is coupled to a second end of the operational amplifier 166. A second end of the fifth capacitor C5 is coupled to the second end of the operational amplifier 166. A first end of the sixth capacitor C6 is coupled to the second end of the operational amplifier 166, and a second end thereof is coupled to a fourth end of the operational amplifier 166.

A first end of the first switch S1 receives the first analog signal, and a second end of the first switch S1 is coupled to a first end of the first capacitor C1. A first end of the second switch S2 receives the second analog signal, and a second end thereof is coupled to a first end of the second capacitor C2. A first end of the third switch S3 is coupled to the first end of the first capacitor C1, and a second end thereof is coupled to a first preset voltage Vcms. A first end of the fourth switch S4 is coupled to the first end of the second capacitor C2, and a second end thereof is coupled to the first preset voltage Vcms. A first end of the fifth switch S5 is coupled to the first end of the third capacitor C3, and a second end thereof is coupled to a second preset voltage Vcmi. A first end of the sixth switch S6 is coupled to the second end of the third capacitor C3, and a second end thereof is coupled to a third preset voltage Vcmo. A first end of the seventh switch S7 receives the first analog signal, and a second end thereof is coupled to a first end of the fourth capacitor C4. A first end of the eighth switch S8 receives the second analog signal, and a second end thereof is coupled to a first end of the fifth capacitor C5. A first end of the ninth switch S9 is coupled to the first end of the fourth capacitor C4, and a second end thereof is coupled to the first preset voltage Vcms. A first end of the tenth switch S10 is coupled to the first end of the fifth capacitor C5, and a second end thereof is coupled to the first preset voltage Vcms. A first end of the eleventh switch S11 is coupled to the first end of the sixth capacitor C6, and a second end thereof is coupled to the second preset voltage Vcmi. A first end of the twelfth switch S12 is coupled to the second end of the sixth capacitor C6, and a second end thereof is coupled to the third preset voltage Vcmo.

The phase sequencer 168 is coupled to the first switch S1 to twelfth switch S12, and charges and discharges the first capacitor C1, the second capacitor C2, the third capacitor C3, the fourth capacitor C4, the fifth capacitor C5, and the sixth capacitor C6 by controlling the opening and closing timing of the first switch S1 to twelfth switch S12, thereby achieving the difference operation, and appropriately designs capacitance values of the first to sixth capacitors (C1 to C6), so that an output voltage Vo may correspond to the output voltage Vo of the full dynamic range.

The capacitance values of the first capacitor C1, the second capacitor C2, the fourth capacitor C4, and the fifth capacitor C5 are Cs, and the capacitance values of the third capacitor C3 and the sixth capacitor C6 are Ch. The Vcms is a common voltage, Vb is a second voltage, that is, $$Vb = Ib \times R_{poly} = K \times \frac{Vbg}{Rpoly} \times R_{poly},$$

and may be regarded as a reference voltage. Va is a first voltage, that is, $$Va = Ibx \times R_{poly} = K \times \frac{Vbg}{R_{ext}} \times R_{poly},$$

and may be regarded as a voltage carrying variation amount information.

The first analog signal is Vcms plus (Va/2), and the second analog signal is Vcms minus (Vb/2).

Figure 7:
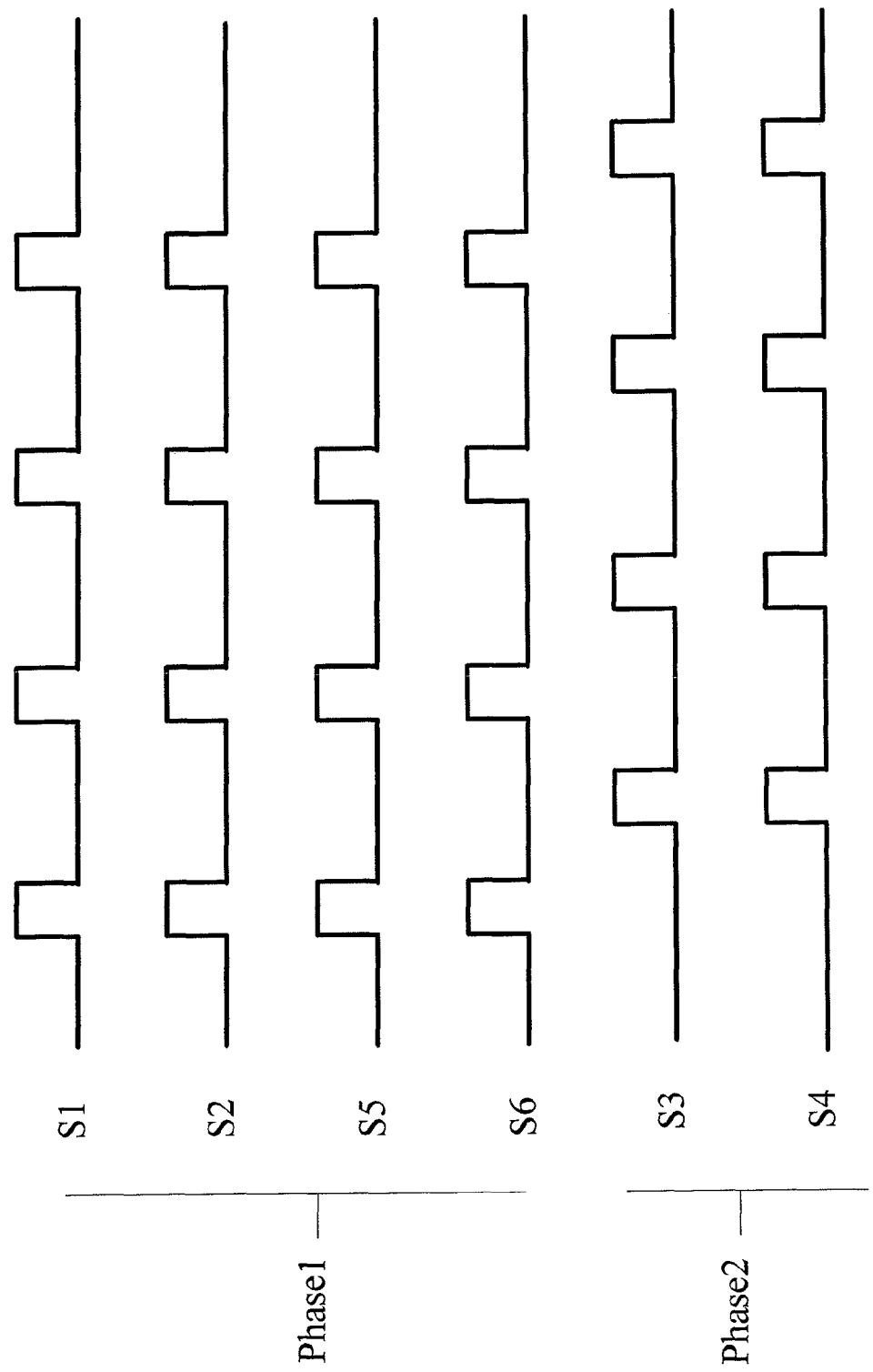
FIG. 7 is a timing diagram of control signals of a phase sequencer in FIG. 6 for respective switches.

Then, Please refer to FIG. 7, which is a control timing diagram of the phase sequencer 168 in the fourth embodiment shown in FIG. 6. In a phase sequence phase1, the first analog signal and the second analog signal charge the first capacitor C1 and the second capacitor C2. At this time, the first switch S1, the second switch S2, the fifth switch S5, and the sixth switch S6 are closed, and the third switch S3 and the fourth switch S4 are open. Therefore, the first capacitor C1 and the second capacitor C2 are charged, so that a total capacitance value is shown as follows:

$$Q=Cs(Vcms+Va/2-Vcmi)+Cs(Vcms-Vb/2-Vcmi).$$

In a phase sequence phase2, the first switch S1, the second switch S2, the fifth switch S5, and the sixth switch S6 are open, and the third switch S3 and the fourth switch S4 are closed. Therefore, charges in the first capacitor C1 and the second capacitor C2 gather at the third capacitor C3, so that the third capacitor C3 is charged, and the first operation voltage is shown as follows:

$$Vo^+ = Vcmo + \frac{Cs}{Ch}\frac{Va-Vb}{2}.$$

Likewise, in the phase sequence phase1, the first analog signal and the second analog signal pass through a path where the seventh switch S7, the eighth switch S8, the eleventh switch S11 and the twelfth switch S12 are closed, and the ninth switch S9 and the tenth switch S10 are open, so that the fourth capacitor C4 and the fifth capacitor C5 are charged, and a total capacitance value thereof is shown as follows:

$$Q=Cs(Vcms+Va/2-Vcmi)+Cs(Vcms-Vb/2-Vcmi).$$

In the phase sequence phase2, the seventh switch S7, the eighth switch S8, the eleventh switch S11 and the twelfth switch S12 are open, and the ninth switch S9 and the tenth switch S10 are closed. Therefore, charges in the fourth capacitor C4 and the fifth capacitor C5 gather at the sixth capacitor C6, so that the sixth capacitor C6 is charged, and the second operation voltage is as follows:

$$Vo^- = Vcmo + \frac{Cs}{Ch}\frac{Vb-Va}{2}.$$

Therefore, the output voltage is $$Vo = Vo^+ - Vo^- = \frac{Cs}{Ch}(Va-Vb),$$

and it may be obtained through formula derivation that the output voltage Vo is equal to a constant K multiplied by Δ, that is, Vo=K×Δ, which means that the output voltage Vo may be directly mapped to the full dynamic range of the analog-digital converter 40. Therefore, the capacitance values Cs of the first capacitor to the fourth capacitor and the capacitance values Ch of the third capacitor and the sixth capacitor may be used to adjust the output voltage Vo, so that the output voltage Vo is mapped to the full dynamic range of the analog-digital converter 40. The method for adjusting the variable impedance is similar to that in Example 1 and Example 2, which is not described herein again.

Figure 8:
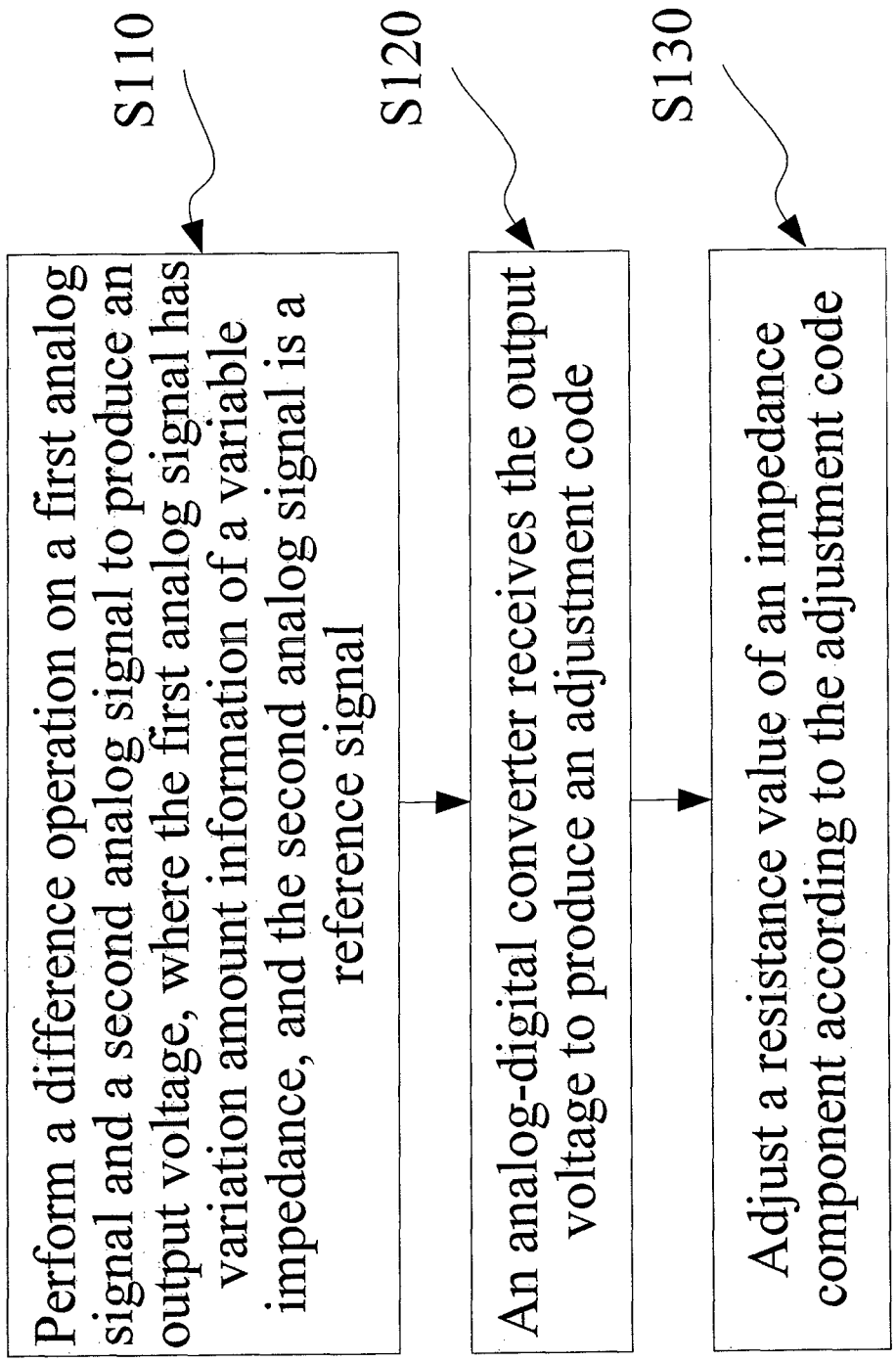
FIG. 8 is a flow chart of an impedance calibration method according to the disclosure.

FIG. 8 is a flow chart of an impedance self-calibration method according to an embodiment of the disclosure, which includes the following steps.

In Step S110, a difference operation is performed on a first analog signal and a second analog signal to generate an output voltage, where the first analog signal has variation amount information of a variable impedance, and the second analog signal is a reference signal.

In Step S120, an analog-digital converter receives the output voltage to generate an adjustment code.

In Step S130, a resistance value of the variable impedance is adjusted according to the adjustment code.

The output voltage is mapped to a full dynamic range of the analog-digital converter.

Alternatively, the impedance self-calibration method may further include a step of adjusting the output voltage, so that the output voltage is mapped to the full dynamic range of the analog-digital converter.

The first analog signal is a current or a voltage, and the second analog signal is a current or a voltage.

The disclosure puts forward a self-calibration mechanism, which is aimed at calibrating the impedance deviation caused by a process variation. The variable impedance generally exists in a filter, an oscillator, as well as a transmitter and a receiver of a communication system. Therefore, in the disclosure, by adjusting the resistance value of the variable impedance, a bandwidth may be corrected in the filter, or a frequency may be corrected in the oscillator, and impedance matching may be achieved between internal impedances of the transmitter and the receiver of the communication system.

To sum up, in the impedance calibration device and method according to the disclosure, a self-calibration mechanism is used. First, in an analog domain, a difference operation is performed on the second analog signal used for reference and the first analog signal corresponding to the resistance value of the variable impedance, so as to obtain the variation amount of the resistance value of the variable impedance. The variation amount is converted into a digital code (that is, the adjustment code), so that a digital circuit (that is, the controller), determines the variation amount of the process, and corrects the resistance value of the variable impedance according to the variation amount of the process by utilizing a programmable characteristic of a digital domain. In some embodiments, according to the impedance calibration device and method of the disclosure, before the analog-digital conversion is performed, the difference may be amplified up to the full dynamic range of the analog-digital converter, so as to improve the accuracy of the calibration of the resistance value. In some embodiments, according to the impedance calibration device and method of the disclosure, an analog-digital converter of an analog front-end circuit (AFE) in the system may be directly used. That is to say, the analog-digital converter may be shared with another circuit. Therefore, only a small quantity of hardware resources need be added to achieve the calibration of the impedance, thereby reducing the testing cost.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An impedance calibration device, comprising:
   a variable impedance;
   an operational unit, used for receiving a first analog signal and a second analog signal and performing a difference operation to generate an output voltage, wherein the first analog signal has variation amount information of the variable impedance, and the second analog signal is a reference signal that does not substantially change along with process drift;
   an analog-digital converter, coupled to the operational unit, and used for receiving the output voltage to generate an adjustment code; and
   a controller, coupled to the analog-digital converter and the variable impedance, and used for adjusting a resistance value of the variable impedance according to the adjustment code.

2. The impedance calibration device according to claim 1, further comprising:
   a gain controller, coupled between the operational unit and the analog-digital converter, and used for adjusting a voltage of the output voltage.

3. The impedance calibration device according to claim 2, wherein the output voltage is mapped to a full dynamic range of the analog-digital converter.

4. The impedance calibration device according to claim 1, wherein the controller adjusts the resistance value of the variable impedance according to a maximum variation amount of the variable impedance and a full dynamic range of the analog-digital converter.

5. The impedance calibration device according to claim 1, wherein the first analog signal is a first current generated according to a ratio between a predetermined voltage and a resistor, and the second analog signal is a second current generated according to a ratio between the predetermined voltage and a reference resistor, wherein the resistor has the variation amount information of the variable impedance.

6. The impedance calibration device according to claim 5, wherein the resistance value of the variable impedance is increased according to the adjustment code when the output voltage is a positive value, and the resistance value of the variable impedance is decreased according to the adjustment code when the output voltage is a negative value.

7. The impedance calibration device according to claim 1, wherein the operational unit comprises:
   a subtractor, used for comparing the first analog signal and the second analog signal to obtain a difference and producing a difference current corresponding to the difference;
   an operational amplifier, wherein a first end of the operational amplifier is grounded, and a second end of the operational amplifier is used for receiving the difference current;
   a first transistor, wherein a second end of the first transistor is coupled to a third end of the operational amplifier, and a first end of the first transistor is connected to a power supply;
   a second transistor, wherein a second end of the second transistor is coupled to the second end of the first transistor, and a first end of the second transistor is connected to the power supply;
   a first resistor, wherein a first end of the first resistor is coupled to the second end of the operational amplifier, and a second end of the first resistor is coupled to a third end of the first transistor;
   a second resistor, wherein a first end of the second resistor is coupled to the third end of the first transistor, and the second end of the second resistor is coupled to a ground end; and
   a third resistor, wherein a first end of the third resistor is coupled to the third end of the first transistor, a second end of the third resistor is coupled to a third end of the second transistor, and the second end of the third resistor is used for producing the output voltage.

8. The impedance calibration device according to claim 1, wherein the operational unit comprises:
   a subtractor, used for subtracting the second analog signal from the first analog signal to generate a difference current;
   an operational amplifier, wherein a first end of the operational amplifier is used for receiving the difference current, a second end of the operational amplifier is grounded, and a third end of the operational amplifier is used for outputting the output voltage; and
   a resistor, wherein a first end of the resistor is coupled to the first end of the operational amplifier, and a second end of the resistor is coupled to the third end of the operational amplifier.

9. The impedance calibration device according to claim 1, wherein the operational unit comprises:
   an operational amplifier, wherein a third end of the operational amplifier is used for outputting the output voltage;
   a first resistor, wherein a first end of the first resistor is used for receiving the first analog signal, and a second end of the first resistor is coupled to a first end of the operational amplifier;
   a second resistor, wherein a first end of the second resistor is used for receiving the second analog signal, and a second end of the second resistor is coupled to a second end of the operational amplifier;
   a third resistor, wherein a first end of the third resistor is coupled to the first end of the operational amplifier, and a second end of the third resistor is coupled to the third end of the operational amplifier; and
   a fourth resistor, wherein a first end of the fourth resistor is coupled to the second end of the operational amplifier, and a second end of the fourth resistor is coupled to the third end of the operational amplifier.

10. The impedance calibration device according to claim 1, wherein the operational unit comprises:
    a capacitor switching unit, having a plurality of capacitors and a plurality of switches;

a phase sequencer, coupled to the capacitor switching unit, and used for controlling opening and closing timing of these switches to charge and discharge these capacitors; and an operational amplifier, coupled to the capacitor switching unit, and used for producing the output voltage by switching these capacitors and according to magnitudes of capacitance values of these capacitors, so that the output voltage corresponds to a full dynamic range of the analog-digital converter.

11. The impedance calibration device according to claim 10, wherein the capacitor switching unit comprises:
a first capacitor, wherein a second end of the first capacitor is coupled to a first end of the operational amplifier;
a second capacitor, wherein a second end of the second capacitor is coupled to the first end of the operational amplifier;
a third capacitor, wherein a first end of the third capacitor is coupled to the first end of the operational amplifier, and a second end of the third capacitor is coupled to a third end of the operational amplifier;
a first switch, wherein a first end of the first switch is used for receiving the first analog signal, and a second end of the first switch is coupled to a first end of the first capacitor;
a second switch, wherein a first end of the second switch is used for receiving the second analog signal, and the second end of the second switch is coupled to a first end of the second capacitor;
a third switch, wherein a first end of the third switch is coupled to the first end of the first capacitor, and a second end of the third switch is coupled to a first preset voltage;
a fourth switch, wherein a first end of the fourth switch is coupled to the first end of the second capacitor, and a second end of the fourth switch is coupled to the first preset voltage;
a fifth switch, wherein a first end of the fifth switch is coupled to the first end of the third capacitor, and a second end of the fifth switch is coupled to a second preset voltage;
a sixth switch, wherein a first end of the sixth switch is coupled to the second end of the third capacitor, and a second end of the sixth switch is coupled to a third preset voltage;
a fourth capacitor, wherein a second end of the fourth capacitor is coupled to a second end of the operational amplifier;
a fifth capacitor, wherein a second end of the fifth capacitor is coupled to the second end of the operational amplifier;
a sixth capacitor, wherein a first end of the sixth capacitor is coupled to the second end of the operational amplifier, and the second end of the sixth capacitor is coupled to a fourth end of the operational amplifier;
a seventh switch, wherein a first end of the seventh switch is used for receiving the first analog signal, and a second end of the seventh switch is coupled to a first end of the fourth capacitor;

an eighth switch, wherein a first end of the eighth switch is used for receiving the second analog signal, and a second end of the eighth switch is coupled to a first end of the fifth capacitor;
a ninth switch, wherein a first end of the ninth switch is coupled to the first end of the fourth capacitor, and a second end of the ninth switch is coupled to the first preset voltage;
a tenth switch, wherein a first end of the tenth switch is coupled to the first end of the fifth capacitor, and a second end of the tenth switch is coupled to the first preset voltage;
an eleventh switch, wherein a first end of the eleventh switch is coupled to the first end of the sixth capacitor, and a second end of the eleventh switch is coupled to the second preset voltage; and
a twelfth switch, wherein a first end of the twelfth switch is coupled to a second end of the sixth capacitor, and a second end of the twelfth switch is coupled to the third preset voltage.

12. The impedance calibration device according to claim 1, wherein the output voltage is mapped to a full dynamic range of the analog-digital converter.

13. An impedance calibration method, comprising:
performing a difference operation on a first analog signal and a second analog signal to generate an output voltage, wherein the first analog signal has variation amount information of a variable impedance, and the second analog signal is a reference signal that does not substantially change along with process drift;
an analog-digital converter receiving the output voltage to generate an adjustment code; and
adjusting a resistance value of the variable impedance according to the adjustment code.

14. The impedance calibration method according to claim 13, further comprising:
adjusting the output voltage for mapping the output voltage to a full dynamic range of the analog-digital converter.

15. The impedance calibration method according to claim 13, wherein the first analog signal and the second analog signal are current signals or voltage signals.

16. The impedance calibration method according to claim 13, wherein the first analog signal is a first current generated according to a ratio between a predetermined voltage and a resistor, and the second analog signal is a second current generated according to a ratio between the predetermined voltage and a reference resistor, and the resistor has the variation amount information of the variable impedance.

17. The impedance calibration method according to claim 13, wherein the adjusting step comprises:
adjusting the resistance value of the variable impedance according to a table look-up method and the adjustment code.

18. The impedance calibration method according to claim 13, wherein the adjusting step comprises:
adjusting the resistance value of the variable impedance according to a maximum variation amount of the variable impedance and a full dynamic range of the analog-digital converter.

* * * * *